(12) United States Patent
Wang et al.

(10) Patent No.: US 9,054,125 B2
(45) Date of Patent: Jun. 9, 2015

(54) METHOD FOR MAKING SEMICONDUCTOR DEVICE WITH GATE PROFILE CONTROL

(71) Applicant: Taiwan Semiconductor Manufacturing Co., Ltd., Hsin-Chu (TW)

(72) Inventors: Tzu-Chung Wang, Hsinchu (TW); Tzu-Yen Hsieh, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 18 days.

(21) Appl. No.: 13/873,298

(22) Filed: Apr. 30, 2013

(65) Prior Publication Data

US 2014/0322872 A1  Oct. 30, 2014

(51) Int. Cl.
*H01L 21/336*  (2006.01)
*H01L 27/092*  (2006.01)
*H01L 29/66*  (2006.01)

(52) U.S. Cl.
CPC .............................. *H01L 29/66477* (2013.01)

(58) Field of Classification Search
USPC ............................................................ 438/585
See application file for complete search history.

(56) References Cited

U.S. PATENT DOCUMENTS

| 6,524,938 | B1 | 2/2003 | Tao et al. |
| 6,849,531 | B1 | 2/2005 | Lin et al. |
| 8,390,072 | B2 | 3/2013 | Chuang et al. |
| 2011/0127613 | A1* | 6/2011 | Beyer et al. .................. 257/369 |

* cited by examiner

*Primary Examiner* — Asok K Sarkar
(74) *Attorney, Agent, or Firm* — Duane Morris LLP

(57) ABSTRACT

A method for forming a semiconductor device includes forming a gate structure over a semiconductor substrate. The gate structure includes a gate electrode, at least two hard mask (HM) layers over the gate electrode, and a spacer abutting a side wall of the gate electrode and the at least two hard mask layers. The method further comprises forming a contact etch stop layer (CESL) over the gate structure, exposing at least one of the HM layers after forming the CESL, and removing the exposed at least one of the HM layers.

17 Claims, 7 Drawing Sheets

METHOD FOR MAKING SEMICONDUCTOR DEVICE WITH GATE PROFILE CONTROL

This application claims the benefit of U.S. Provisional Application No. 61/781,556, filed Mar. 14, 2013, which application is expressly incorporated by reference herein in its entirety.

FIELD

The disclosed method relates to semiconductors. More particularly, the disclosed subject matter relates to a method for making a gate structure of a semiconductor device with good gate profile control.

BACKGROUND

Metal oxide semiconductor (MOS) transistors are building blocks for integrated circuits, and MOS devices continue to be scaled to smaller sizes for advanced performance targets. MOS technology includes N-type metal oxide semiconductor (NMOS) and P-type metal oxide semiconductor (PMOS) transistors.

An MOS transistor generally comprises a semiconductor substrate, a channel layer above the semiconductor substrate, a gate dielectric layer and a gate electrode above the channel layer, and source and drain diffusion regions in the surface of the semiconductor substrate. Contacts are made to the gate electrode and to both the source and drain regions of the transistor. With the advent of high-k dielectric materials as the gate insulating layer in the MOS process, metal gates or metal layers can be used in the devices.

A gate electrode comprises a conductive material and is electrically isolated from the semiconductor substrate by the gate dielectric layer. When a sufficiently high gate voltage is applied, an electrically conductive inversion layer or channel forms at the interface between the gate dielectric layer and the semiconductor substrate. The conductive channel extends between the source and the drain, whereby current flows through the channel when a voltage is applied between the source and drain.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

DETAILED DESCRIPTION

Figure 1:
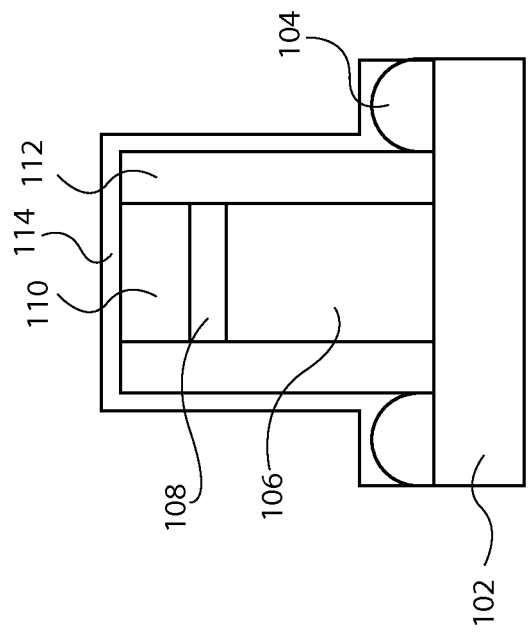
FIGS. 1-9 are cross-sectional views of a portion of a semiconductor device during fabrication, illustrating a method of forming a semiconductor device in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Some embodiments provide a method for forming a semiconductor device, particularly a method for defining a gate of a metal oxide semiconductor (MOS) transistor. In some embodiments, the method comprises forming a gate structure including a gate electrode, at least two hard mask (HM) layers over the gate electrode, and a spacer abutting a side wall of the gate electrode and the at least two hard mask layers. In some embodiments, a method provides an approach of defining gate profile and height by controlling the spacer height, and a process of removing the hard mask layers.

Figure 8:
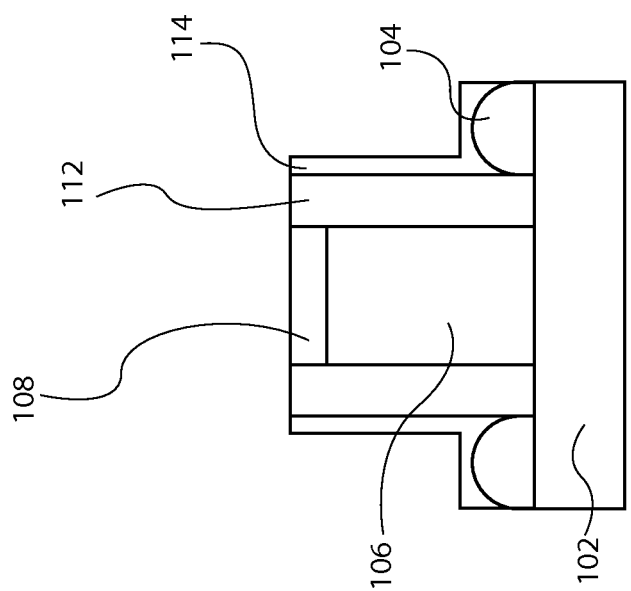
Figure 9:
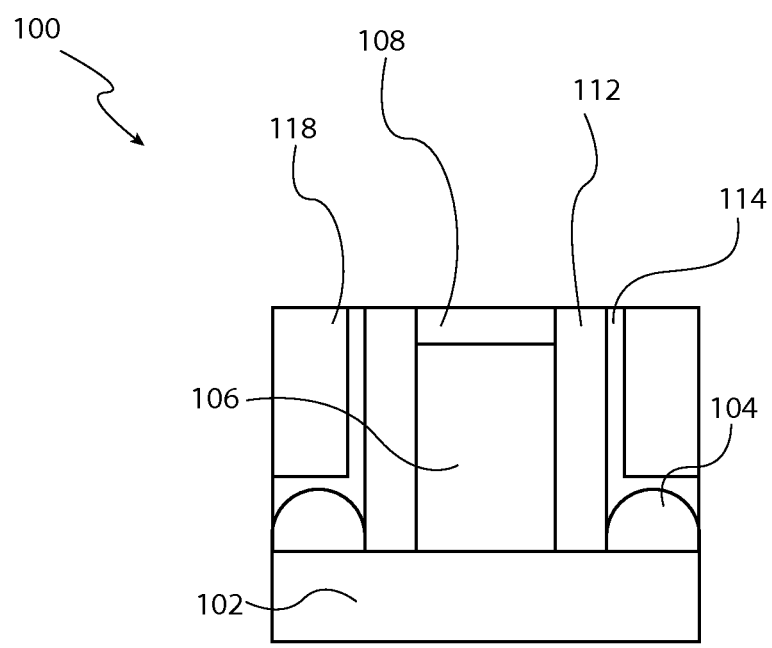
Figure 10:
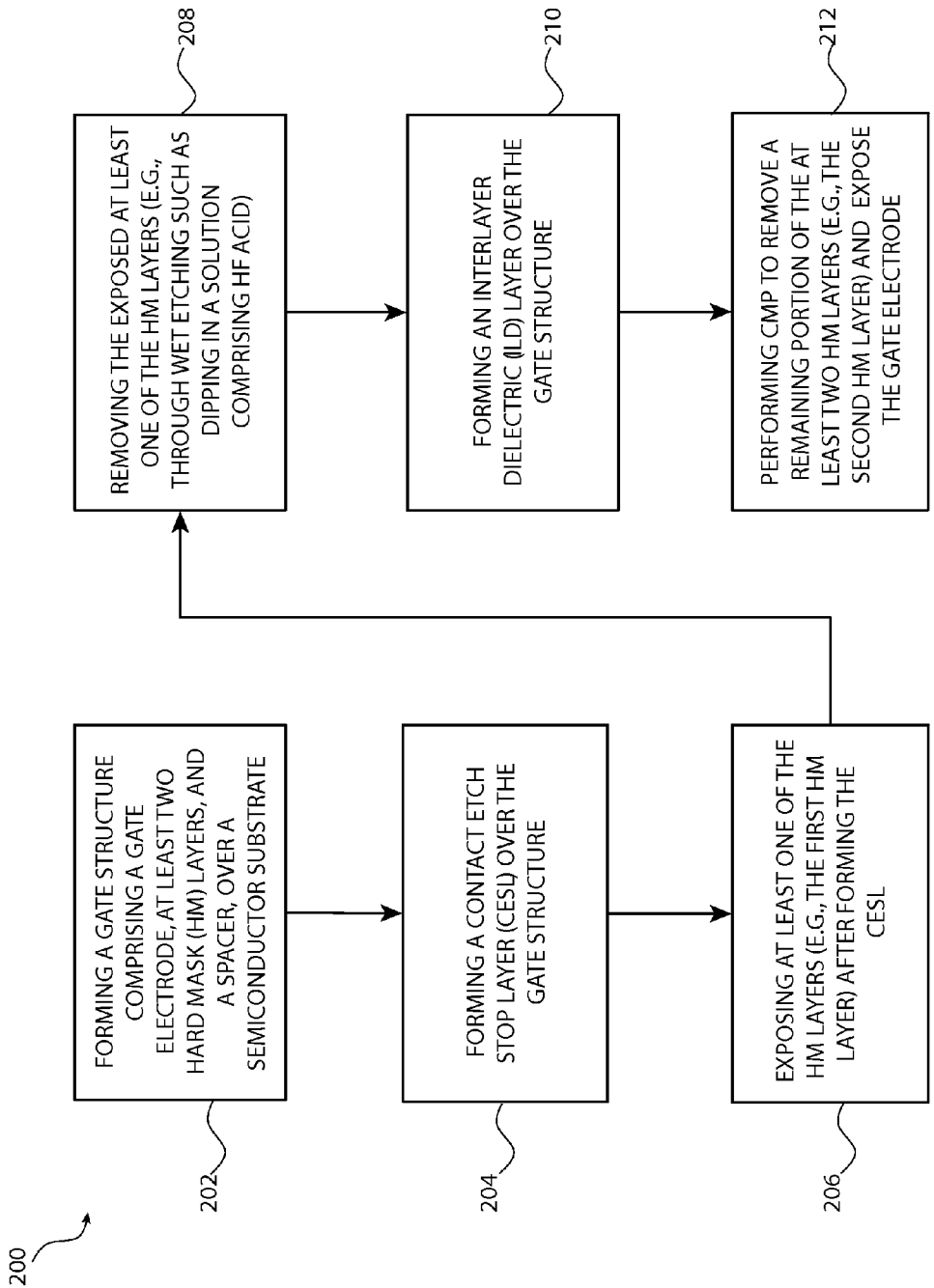
FIG. 10 is a flow chart illustrating an exemplary method for forming a semiconductor device in accordance with some embodiments.
Figure 11:
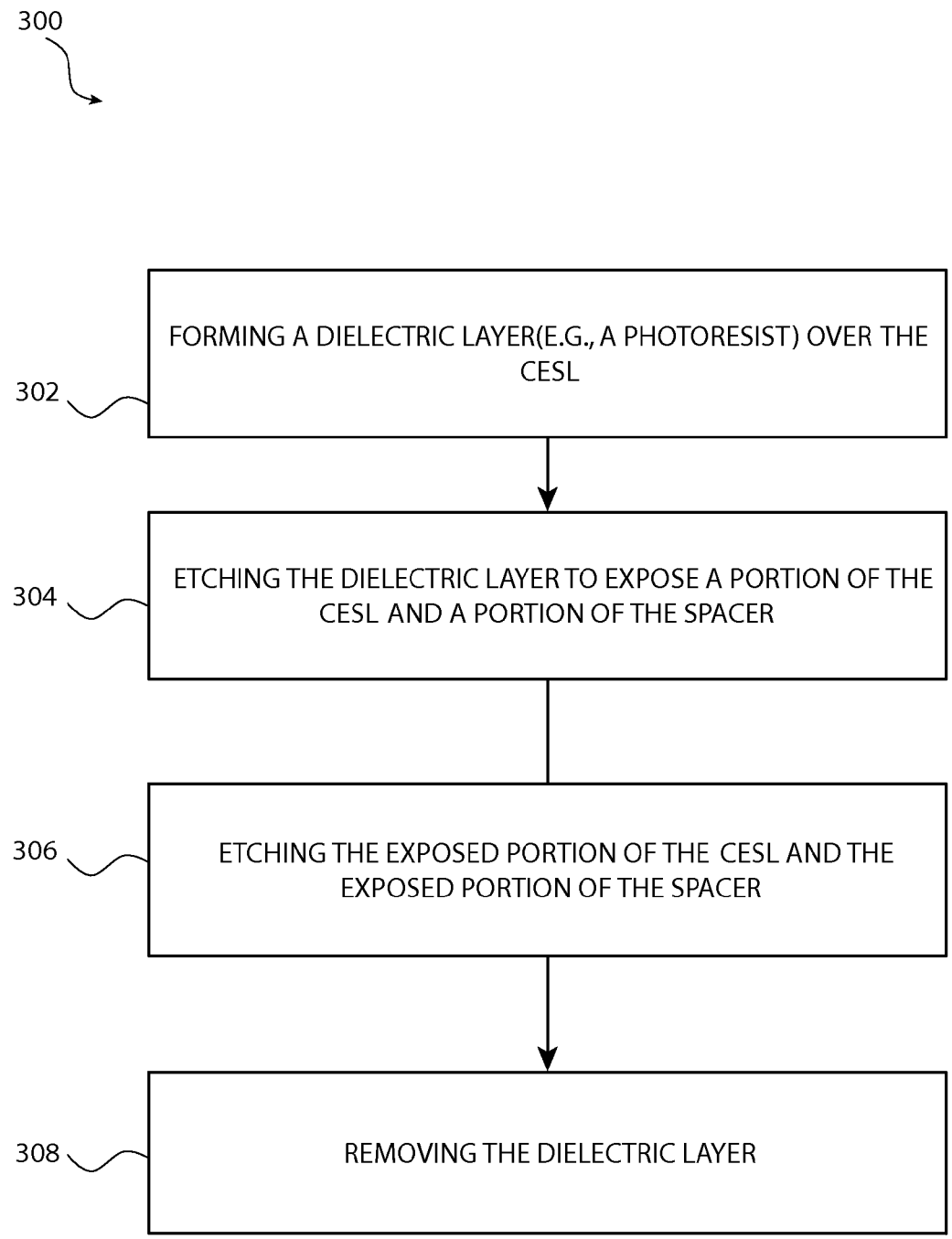
FIG. 11 is a flow chart illustrating a method of exposing at least one of the hard mask (HM) layers in the exemplary method of FIG. 10 in some embodiments.

In FIGS. 1-9, like items are indicated by like reference numerals, and for brevity, descriptions of the structure, provided above with reference to the previous figures, are not repeated. The methods described in FIGS. 10-11 are described with reference to the exemplary structure described in FIGS. 1-7. FIG. 10 illustrates an exemplary method 200 for forming a semiconductor device 100 in FIG. 9 in accordance with some embodiments.

Referring to FIG. 10, at step 202, a gate structure 105 is provided over a semiconductor substrate 102. The structure of a portion of semiconductor device during fabrication is illustrated in FIG. 1. Substrate 102 can be a wafer comprising a semiconductor material. Examples of suitable materials for substrate 102 include but are not limited to silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass.

Gate structure 105 comprises a gate electrode 106, at least two hard mask (HM) layers 109 over gate electrode 106, and a spacer 112 abutting a side wall of gate electrode 106 and the at least two hard mask layers 109.

Gate electrode 106 comprises any suitable material in any suitable configuration. Examples of suitable materials for gate electrode include but are not limited to amorphous silicon, polysilicon, polysilicon/ germanium, aluminum, copper, titanium, tantalum, tungsten, molybdenum, platinum, tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. The conductive material of gate electrode 106 may be doped or undoped. In some embodiments, gate electrode 106 includes a work function layer tuned to have a proper work function for enhanced performance of the field effect transistor devices of an integrated circuit. For example, where the field effect transistor devices are N MOSFETs, the work function layer includes an n-type work function metal (n-metal), such as Ta, TiAl, TiAlN, TaCN, other n-type work function metal, or a combination thereof. Where the field effect transistor device is a P MOSFET, the work function layer includes a p-type work function metal (p-metal), such as TiN, TaN, other p-type work function metal, or combination thereof. In some embodiments, gate electrode 106 comprises polysilicon. In some embodiments, gate electrode 106 is a dummy gate which is to be replaced by another conductive material.

The at least two HM layers 109 over gate electrode 106 can be formed of any suitable material. Examples of a suitable material for the at least two HM layers 109 include but are not limited to silicon oxide, silicon nitride (e.g., $Si_3N_4$), SiON, SiC, SiOC, or any combination thereof. In some embodiments, the at least two HM layers 109 comprise a first HM layer 110 and a second HM layer 108. The second HM layer 108 is disposed over the gate electrode 106, and the first HM layer 110 is disposed over the second HM layer 108. In some embodiments, the first HM layer 110 comprises silicon oxide and the second HM layer 108 comprises silicon nitride.

Spacer 112 along the side walls of gate electrode 106 can be formed of oxides, nitrides, oxynitrides, combination thereof and other suitable insulating materials. In some embodiments, spacer 112 is formed of silicon nitrides (e.g., $Si_3N_4$).

In some embodiments, gate structure 105 is disposed over a metal oxide semiconductor (MOS) transistor comprising source/drain regions (not shown), a channel layer (not shown) and at least one contact structure 104 above the source/drain regions. The channel layer can be below gate electrode 106. The source/drain regions are on both sides of the channel layer. In some embodiments, a gate dielectric layer (not shown) can be optionally disposed between the channel layer and gate electrode 106. For example, the gate dielectric layer can comprise a high-k dielectric material. Examples of a high-k dielectric material include but are not limited to hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), tantalum pentaoxide ($Ta_2O_5$), aluminum oxide ($Al_2O_3$), titanium dioxide ($TiO_2$), and combinations thereof.

Figure 2:
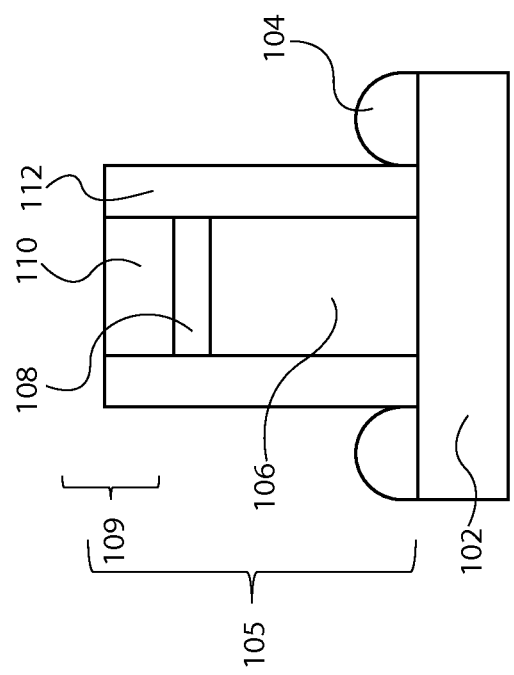

At step 204 of FIG. 10, a contact etch stop layer (CESL) 114 is formed over the gate structure 105. The resulting structure after step 204 is shown in FIG. 2. The CESL 114 can be formed of silicon nitride, silicon oxynitride, silicon carbide, silicon oxycarbide, combinations thereof, or other suitable materials. In some embodiments, the CESL 114 is formed of silicon nitride. The CESL 114 can be formed by using chemical vapor deposition (CVD), high density plasma CVD, sputtering, or other suitable method. If applicable, the CESL 114 is also formed over the at least one contact structure 104 above the source/drain regions.

Figure 6:
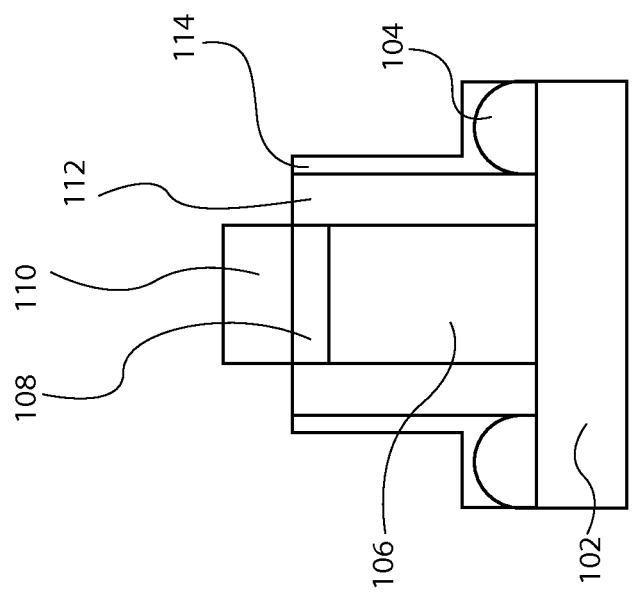

At step 206 of FIG. 10, at least one of the HM layers 109 is exposed after forming the CESL 114. The resulting structure of the semiconductor device after step 206 is shown in FIG. 6. FIG. 11 illustrates a method 300 of exposing at least one of the HM layers 109 in the exemplary method of FIG. 10 in some embodiments.

Referring to FIG. 11, in some embodiments, method 300 of exposing at least one of the HM layers 109 comprises steps 302, 304, 306, and 308. In some embodiments, the first HM layer 110 is exposed after these steps.

Figure 3:
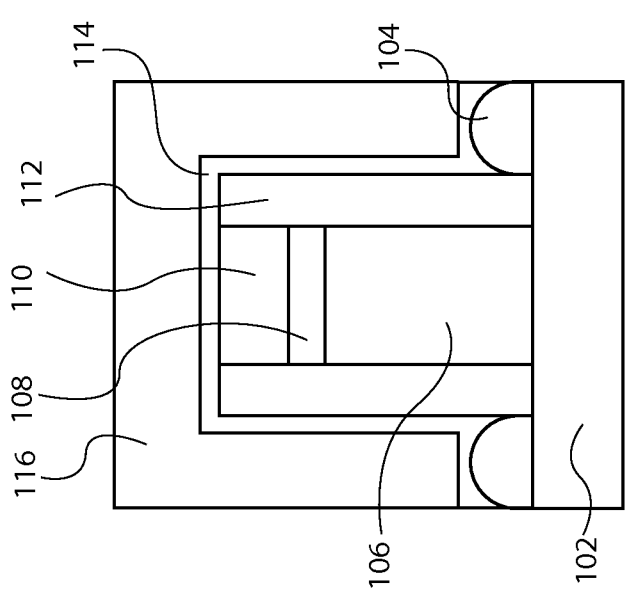

At step 302, a dielectric layer 116 is formed over the CESL 114. The resulting structure of the semiconductor device is shown in FIG. 3. Examples of a suitable material for dielectric layer 116 include but are not limited to a photoresist material, silicon oxide and any other suitable materials. Dielectric layer 116 can comprise a photoresist material in some embodiments. A photoresist material can be either a positive or negative photoresist.

Figure 4:
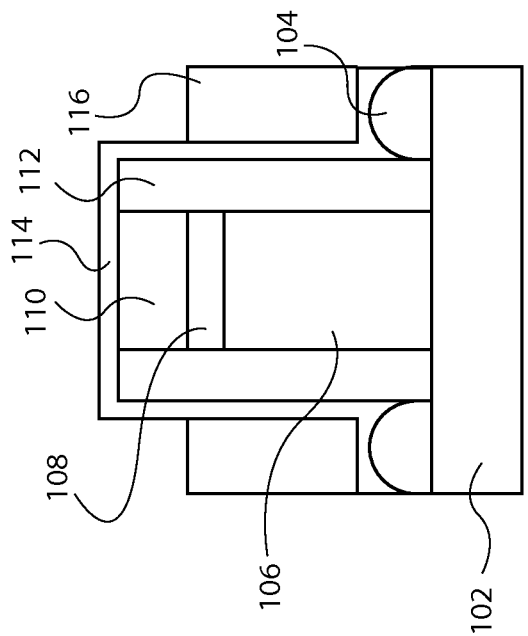

At step 304, dielectric layer 116 is etched back to expose a portion of the CESL 114. A portion of spacer 112 can also be exposed or protrude above a top surface of the dielectric layer 116. The resulting structure after step 304 is illustrated in FIG. 4. In some embodiments, after step 304, dielectric layer 116 has a top surface coplanar with a bottom surface of the at least one of the HM layers 109 to be removed. In some embodiments, after step 304 of etching dielectric layer 116, dielectric layer 116 has a top surface coplanar with a bottom surface of the first HM layer 110.

Dielectric layer 116 can be etched using a wet etch, dry etch (e.g., RIE, plasma etch), and/or other suitable processes. In some embodiments, dielectric layer 116 is selectively etched using a processing gas comprising plasma, for example, an oxygen-containing plasma.

Figure 5:
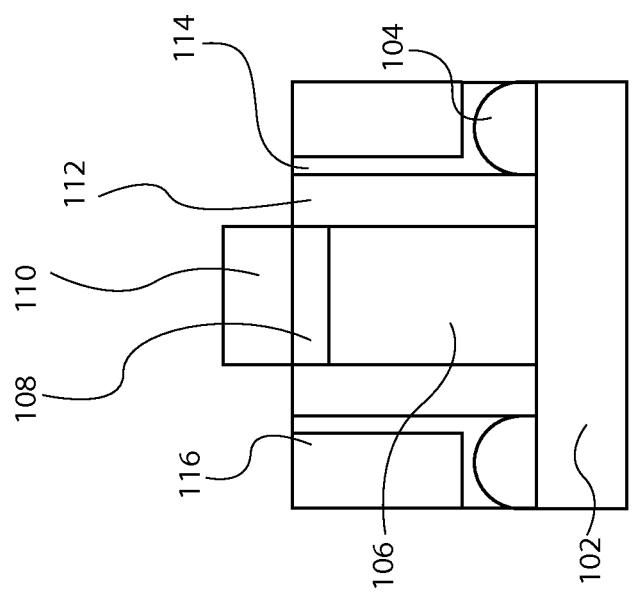

At step 306, the exposed portion of the CESL 114 and the exposed portion of spacer 112 are etched. The resulting structure after step 306 is illustrated in FIG. 5. The etching process at step 306 can be performed using a processing gas comprising plasma, for example, a halogen-containing plasma. The halogen-containing plasma can include fluorine or chlorine in some embodiments.

In some embodiments, both etching the dielectric layer 116 at step 304, and etching the exposed portion of the CESL 114 and the exposed portion of spacer 112 at step 306, are performed through dry etching. The two etching processes at steps 304 and 306 can be performed in the same chamber in some embodiments.

At step 308, dielectric layer 116 is removed. The resulting structure of the semiconductor device after steps 306 and 308 is illustrated in FIG. 6. Dielectric layer 116 can be removed using a wet or dry removal process. For example, in some embodiments, dielectric layer 116, which is a photoresist, can be completely removed through a wet removal process. For example, photoresist layer can be stripped by a solution comprising an ingredient such as $H_2SO_4$, $H_2O_2$, and $NH_4OH$.

Figure 7:
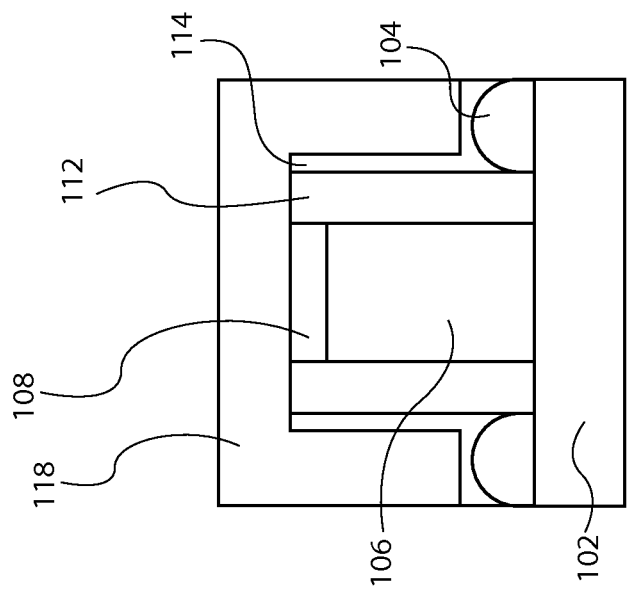

Referring back to FIG. 10, at step 208, the exposed at least one of the HM layers 109 is removed. The resulting structure of the semiconductor device after step 208 is illustrated in FIG. 7. The removal process at step 208 can be performed using a wet or dry etching process. In some embodiments, the exposed at least one of the HM layers 109 is removed through wet etching. For example, the step of removing the exposed at least one of the HM layers 109 comprises dipping gate structure 105 into a solution comprising hydrofluoric (HF) acid. In some embodiments, the first HM layer 110 is removed at step 208 after the first HM layer 110 is exposed at step 206. In some embodiments, the step of removing the exposed the first HM layer 110 comprises dipping gate structure 105 into a solution comprising hydrofluoric (HF) acid. Examples of such a solution include but are not limited to a mixture of HF/Water at a concentration of 1/100 or 1/50 by weight. The dipping time can be in seconds or minutes, for example, from 30 to 150 seconds.

At step 210, an interlayer dielectric (ILD) layer 118 is formed over the gate structure 105. The resulting structure of the semiconductor device after step 210 is illustrated in FIG. 8. Examples of suitable materials for the ILD layer 118 include but are not limited to silicon oxide, silicon oxynitride, phosphosilicate glass (PSG), borophosphosilicate glass (BPSG), combinations thereof, or other suitable material. The ILD layer 118 can be formed by using CVD, high density plasma CVD, spin-on, sputtering, or other suitable method.

At step 212, a chemical mechanical planarizing (CMP) process is performed to remove a remaining portion of the at least two HM layers 109 above gate electrode 106 and expose a top surface of the gate electrode 106. The resulting structure of the semiconductor device after step 212 is illustrated in FIG. 9. In some embodiments, at step 212, the second HM layer 108 is removed using the CMP process. The CMP process can stop when the top surface of gate electrode 106 is reached or exposed.

In some embodiments, the present disclosure provides a method for defining a gate of an MOS transistor, as described above.

The present disclosure provides a method for forming a semiconductor device, particularly a method for defining a gate of a metal oxide semiconductor (MOS) transistor. In some embodiments, the method for forming a semiconductor device comprises forming a gate structure over a semiconductor substrate. The gate structure comprises a gate electrode, at least two hard mask (HM) layers over the gate electrode, and a spacer abutting a side wall of the gate electrode and the at least two hard mask layers. The method further comprises forming a contact etch stop layer (CESL) over the gate structure, exposing at least one of the HM layers after forming the CESL, and removing the exposed at least one of the HM layers. In some embodiments, the exposed at least one of the HM layers is removed through wet etching. For example, the step of removing the exposed at least one of the HM layers comprises dipping the gate structure into a solution comprising hydrofluoric (HF) acid.

In some embodiments, the step of exposing at least one of the HM layers comprises forming a dielectric layer over the CESL, etching the dielectric layer to expose a portion of the CESL and a portion of the spacer, etching the exposed portion of the CESL and the exposed portion of the spacer, and removing the dielectric layer. The dielectric layer can comprise a photoresist material in some embodiments. In some embodiments, after the step of etching the dielectric layer to expose a portion of the CESL and a portion of the spacer, the dielectric layer has a top surface coplanar with a bottom surface of the at least one of the HM layers to be removed.

In some embodiments, the at least two HM layers comprise a first HM layer and a second HM layer. The second HM layer is disposed over the gate electrode, and the first HM layer is disposed over the second HM layer. In some embodiments, the first HM layer comprises silicon oxide and the second HM layer comprises silicon nitride. The first HM layer is removed after exposing the at least one HM layer in some embodiments.

In some embodiments, the method further comprises forming an interlayer dielectric (ILD) layer over the gate structure, and performing a CMP process to remove a remaining portion of the at least two HM layers above the gate electrode and expose a top surface of the gate electrode.

In some embodiments, the present disclosure provides an exemplary method for forming a semiconductor device. Such a method comprises forming a gate structure over a semiconductor substrate. The gate structure comprising a gate electrode, a first HM layer and a second HM layer over the gate electrode, and a spacer abutting a side wall of the gate electrode and the two HM layers. The first HM layer is over the second HM layer. The method further comprises forming a CESL over the gate structure, exposing the first HM layer after forming the CESL, and removing the first HM layer. In some embodiments, the step of removing the exposed the first HM layer comprises dipping the gate structure into a solution comprising HF acid. In some embodiments, the gate structure is disposed over a metal oxide semiconductor (MOS) transistor comprising source/drain regions and at least one contact structure above the source/drain regions. The CESL is also formed over the at least one contact structure above the source/drain regions.

In some embodiments, the step of exposing at least the first HM layer comprises forming a dielectric layer such as a photoresist material over the CESL, etching the dielectric layer to expose a portion of the CESL and a portion of the spacer, etching the exposed portion of the CESL and the exposed portion of the spacer, and removing the dielectric layer. In some embodiments, after the step of etching the dielectric layer to expose a portion of the CESL and a portion of the spacer, the dielectric layer has a top surface coplanar with a bottom surface of the first HM layer. In some embodiments, the method further comprises forming an ILD layer over the gate structure, and performing a CMP process to remove the second HM layer and expose a top surface of the gate electrode.

In some embodiments, the present disclosure provides a method for defining a gate of an MOS transistor. Such a method comprises forming a gate structure over a semiconductor substrate. The gate structure comprises a gate electrode, a first HM layer and a second HM layer over the gate electrode, and a spacer abutting a side wall of the gate electrode and the two HM layers. The first HM layer is disposed over the second HM layer. The method further comprises forming a CESL over the gate structure, exposing the first HM layer after forming the CESL, removing the first HM layer using a solution comprising HF acid, forming an ILD layer over the gate structure, and performing a CMP process to remove the second HM layer and expose a top surface of the gate electrode.

In some embodiments, the step of exposing at least the first HM layer comprises forming a dielectric layer over the CESL, etching the dielectric layer to expose a portion of the CESL and a portion of the spacer, etching the exposed portion of the CESL and the exposed portion of the spacer, and removing the dielectric layer. After the dielectric layer is etched, the dielectric layer has a top surface coplanar with a bottom surface of the first HM layer. In some embodiments, both etching the dielectric layer and the dielectric layer, and etching the exposed portion of the CESL and the exposed portion of the spacer, are performed through dry etching.

Although the subject matter has been described in terms of exemplary embodiments, it is not limited thereto. Rather, the appended claims should be construed broadly, to include other variants and embodiments, which may be made by those skilled in the art.

What is claimed is:

1. A method for forming a semiconductor device, comprising:
   forming a gate structure over a semiconductor substrate, the gate structure comprising a gate electrode, at least two hard mask (HM) layers over the gate electrode, and a spacer abutting a side wall of the gate electrode and the at least two hard mask layers;
   forming a contact etch stop layer (CESL) over the gate structure;
   exposing at least one of the HM layers after forming the CESL wherein the step of exposing at least one of the HM layers comprises:
      forming a dielectric layer over the CESL;
      etching the dielectric layer to expose a portion of the CESL and a portion of the spacer;
      etching the exposed portion of the CESL and the exposed portion of the spacer; and
      removing the dielectric layer; and
   removing the exposed at least one of the HM layers.

2. The method of claim 1, wherein the dielectric layer comprises a photoresist material.

3. The method of claim 1, wherein after the step of etching the dielectric layer to expose a portion of the CESL and a portion of the spacer, the dielectric layer has a top surface coplanar with a bottom surface of the at least one of the HM layers to be removed.

4. The method of claim 1, wherein
the at least two HM layers comprise a first HM layer and a second HM layer, the second HM layer disposed over the gate electrode, and the first HM layer disposed over the second HM layer.

5. The method of claim 4, wherein
the first HM layer comprises silicon oxide and the second HM layer comprises silicon nitride.

6. The method of claim 4, wherein
the first HM layer is removed after exposing the at least one HM layer.

7. The method of claim 1, wherein
the exposed at least one of the HM layers is removed through wet etching.

8. The method of claim 7, wherein
the step of removing the exposed at least one of the HM layers comprises dipping the gate structure into a solution comprising hydrofluoric (HF) acid.

9. The method of claim 1, further comprising:
forming an interlayer dielectric (ILD) layer over the gate structure; and
performing a chemical mechanical planarizing (CMP) process to remove a remaining portion of the at least two HM layers above the gate electrode and expose a top surface of the gate electrode.

10. A method for forming a semiconductor device, comprising:
forming a gate structure over a semiconductor substrate, the gate structure comprising a gate electrode, a first HM layer and a second HM layer over the gate electrode, and a spacer abutting a side wall of the gate electrode and the two HM layers, the first HM layer being over the second HM layer;
forming a contact etch stop layer (CESL) over the gate structure;
exposing the first HM layer after forming the CESL, wherein the step of exposing at least the first HM layer comprises:
forming a dielectric layer over the CESL;
etching the dielectric layer to expose a portion of the CESL and a portion of the spacer;
etching the exposed portion of the CESL and the exposed portion of the spacer; and
removing the dielectric layer; and
removing the first HM layer.

11. The method of claim 10, wherein
the gate structure is disposed over a metal oxide semiconductor (MOS) transistor comprising source/drain regions and at least one contact structure above the source/drain regions; and
the CESL is formed over the at least one contact structure above the source/drain regions.

12. The method of claim 10, wherein the dielectric layer comprises a photoresist material.

13. The method of claim 10, wherein after the step of etching the dielectric layer to expose a portion of the CESL and a portion of the spacer, the dielectric layer has a top surface coplanar with a bottom surface of the first HM layer.

14. The method of claim 10, wherein
the step of removing the exposed the first HM layer comprises dipping the gate structure into a solution comprising hydrofluoric (HF) acid.

15. The method of claim 10, further comprising:
forming an interlayer dielectric (ILD) layer over the gate structure; and
performing a chemical mechanical planarizing (CMP) process to remove the second HM layer and expose a top surface of the gate electrode.

16. A method for defining a gate of an MOS transistor, comprising:
forming a gate structure over a semiconductor substrate, the gate structure comprising a gate electrode, a first HM layer and a second HM layer over the gate electrode, and a spacer abutting a side wall of the gate electrode and the two HM layers, the first HM layer being over the second HM layer;
forming a contact etch stop layer (CESL) over the gate structure;
exposing the first HM layer after forming the CESL wherein the step of exposing at least the first HM layer comprises:
forming a dielectric layer over the CESL;
etching the dielectric layer to expose a portion of the CESL and a portion of the spacer, the dielectric layer having a top surface coplanar with a bottom surface of the first HM layer;
etching the exposed portion of the CESL and the exposed portion of the spacer; and
removing the dielectric layer;
removing the first HM layer using a solution comprising hydrofluoric (HF) acid; forming an interlayer dielectric layer over the gate structure; and
performing a chemical mechanical planarizing (CMP) process to remove the second HM layer and expose a top surface of the gate electrode.

17. The method of claim 16, wherein etching the dielectric layer and etching the exposed portion of the CESL and the exposed portion of the spacer, are performed through dry etching.

* * * * *

UNITED STATES PATENT AND TRADEMARK OFFICE
CERTIFICATE OF CORRECTION

PATENT NO. : 9,054,125 B2  
APPLICATION NO. : 13/873298  
DATED : June 9, 2015  
INVENTOR(S) : Tzu-Chung Wang Page 1 of 1

It is certified that error appears in the above-identified patent and that said Letters Patent is hereby corrected as shown below:

IN THE CLAIMS:

Claim 10, Column 7, Line 51, delete "laver" and insert -- layer --

Signed and Sealed this
Thirty-first Day of May, 2016

Michelle K. Lee
*Director of the United States Patent and Trademark Office*